(12) United States Patent
Stocker

(10) Patent No.: US 10,401,450 B2
(45) Date of Patent: Sep. 3, 2019

(54) MAGNETIC RESONANCE APPARATUS WITH A BENDABLE CARRIER FOR SHIM ELEMENTS

(71) Applicant: Siemens Healthcare GmbH, Erlangen (DE)

(72) Inventor: Stefan Stocker, Grossenseebach (DE)

(73) Assignee: Siemens Healthcare GmbH, Erlangen (DE)

( * ) Notice: Subject to any disclaimer, the term of this patent is extended or adjusted under 35 U.S.C. 154(b) by 152 days.

(21) Appl. No.: 15/714,380

(22) Filed: Sep. 25, 2017

(65) Prior Publication Data

US 2018/0088195 A1 Mar. 29, 2018

(30) Foreign Application Priority Data

Sep. 26, 2016 (DE) .................... 20 2016 005 907 U

(51) Int. Cl.
*G01R 33/3873* (2006.01)
*G01R 33/385* (2006.01)

(52) U.S. Cl.
CPC ...... *G01R 33/3873* (2013.01); *G01R 33/3858* (2013.01)

(58) Field of Classification Search
CPC .............. G01R 33/3873; G01R 33/3858
See application file for complete search history.

(56) References Cited

U.S. PATENT DOCUMENTS

| 5,635,839 | A  * | 6/1997  | Srivastava | G01R 33/3873 |
|           |      |         |            | 324/318      |
| 6,798,205 | B2 * | 9/2004  | Bommel     | G01R 33/3873 |
|           |      |         |            | 324/318      |
| 6,867,592 | B2 * | 3/2005  | Gebhardt   | G01R 33/3873 |
|           |      |         |            | 324/309      |
| 7,196,520 | B2 * | 3/2007  | Shen       | G01R 33/3873 |
|           |      |         |            | 324/318      |
| 7,295,012 | B1 * | 11/2007 | Lvovsky    | G01R 33/3873 |
|           |      |         |            | 324/320      |
| 7,683,624 | B2 * | 3/2010  | Tamura     | G01R 33/3815 |
|           |      |         |            | 324/320      |
| 2008/0191698 | A1 * | 8/2008 | Nogami  | G01R 33/3854 |
|           |      |         |            | 324/318      |

* cited by examiner

*Primary Examiner* — G. M. A Hyder
(74) *Attorney, Agent, or Firm* — Schiff Hardin LLP

(57) ABSTRACT

A magnetic resonance apparatus has a magnetic resonance data acquisition scanner having a basic field magnet that generates a basic magnetic field in a patient-receiving zone of the scanner, and a gradient coil unit in the scanner, formed of individual gradient coil elements, and a shim unit having at least one carrier unit that is movably introducible into the scanner, the carrier carrying at least two shim elements formed of a material for shimming the basic magnetic field. The at least one carrier unit is bendable in at least one direction.

11 Claims, 2 Drawing Sheets

MAGNETIC RESONANCE APPARATUS WITH A BENDABLE CARRIER FOR SHIM ELEMENTS

BACKGROUND OF THE INVENTION

Field of the Invention

The present invention concerns a magnetic resonance apparatus having a shim unit.

Description of the Prior Art

A maximally homogeneous basic magnetic field $B_0$ is particularly important for magnetic resonance examinations conducted on a patient. Conventional magnetic resonance apparatuses (i.e. the scanner thereof) include a shim unit in order to minimize and/or eliminate magnetic field inhomogeneities in the basic magnetic field at the site where the scanner of the magnetic resonance apparatus is installed. The shim unit has individual shim elements made of ferromagnetic material, which are introduced and/or arranged in the scanner of the magnetic resonance apparatus. Conventionally, the individual shim elements are mounted and/or arranged on a carrier unit and introduced together with the carrier unit into the scanner.

Because the shim elements extend in the longitudinal direction through the entire scanner, the carrier unit must also extend along the entire longitudinal direction in order to ensure a simple installation of the shim elements. To that end, the carrier unit is designed to be rigid and inflexible so that the shim elements can be introduced thereby into the scanner in the manner of a drawer. A consequence of this is that a relatively large amount of space is required in order to install the shim elements for the purpose of adjusting the basic magnetic field, and as a result it is also necessary to provide a relatively large radio-frequency (RF) cabin (RF shielded room) for the magnetic resonance apparatus.

SUMMARY OF THE INVENTION

An object of the present invention is to provide a shim unit that allows shim elements to be inserted into the scanner of a magnetic resonance apparatus in a space-saving manner.

The invention concerns a magnetic resonance apparatus of the type having a basic field magnet that generates a basic magnetic field, a gradient coil arrangement composed of individual gradient coil elements, and a shim unit, which has at least one carrier unit and two or more shim elements in the carrier unit.

In accordance with the invention, the at least one carrier unit is bendable in at least one direction.

The gradient coil arrangement preferably has three gradient coil elements. A first of the three gradient coil elements is configured for generating a gradient magnetic field in the X-direction of the magnetic resonance scanner. A second of the three gradient coil elements is configured for generating a gradient magnetic field in the Y-direction of the magnetic resonance scanner. A third of the three gradient coil elements is configured for generating a gradient magnetic field in the Z-direction of the magnetic resonance scanner. The X-direction, the Y-direction and the Z-direction of the magnetic resonance apparatus define an orthogonal coordinate system of the scanner, and thus of the magnetic resonance apparatus.

The individual shim elements of the shim unit are preferably formed of a ferromagnetic material. The at least one carrier unit can accommodate a number of shim elements, the individual shim elements of a carrier unit preferably being arranged sequentially on the carrier unit in the longitudinal direction of the carrier unit.

As used herein, a bendable carrier unit means a carrier unit that has a first subsection and a second subsection, wherein the first subsection is situated or can be situated so as to proceed in one direction, in particular the longitudinal direction, of the carrier unit ahead of the second subsection, and wherein the first subsection has a first direction of extent and the second subsection has a second direction of extent, the first direction of extent being at a variable angle with respect to the second direction of extent. Preferably, the variable angle is in a range between 0° and a maximum of 90°.

The at least one direction in which the carrier unit is designed to be bendable is preferably aligned at right angles to the longitudinal extension of the carrier unit, in particular at right angles to the longitudinal extent of the subsection of the carrier unit that is to be bent.

The present invention provides the advantage that the shim unit can be introduced into the scanner of the magnetic resonance apparatus in a space-saving manner, because the subsection that has not yet been introduced into the scanner can be bent through an angle of up to 90° with respect to the subsection that has already been introduced or is currently being introduced.

In an embodiment of the invention, the at least one carrier unit has at least one bending axis, the bending axis being aligned at right angles to the longitudinal direction of the at least one carrier unit. Furthermore, the bending axis is preferably parallel to an extension surface of a carrier baseplate. In particular, the bending axis is arranged at a center of a circle whose radius corresponds to the radius of the bend. This advantageously enables the bending axis to be aligned parallel to lateral surfaces of the individual shim elements, so an easy bending of the at least one carrier unit with the shim elements arranged therein can be achieved.

The at least one carrier unit preferably has a bendable carrier baseplate. As used herein, a bendable carrier baseplate means a carrier baseplate that has a first subsection and a second subsection, wherein the first subsection is arranged in one direction, in particular the longitudinal direction, of the carrier baseplate ahead of the second subsection, and wherein the first subsection has a first direction of extent and the second subsection has a second direction of extent, the first direction of extent being at a variable angle with respect to the second direction of extent. Preferably, the variable angle is in a range between 0° and a maximum of 90°. Such a bendable carrier baseplate achieves stability of the carrier unit when the at least one carrier unit with the shim elements arranged therein is inserted, while still allowing a high degree of flexibility of the at least one carrier unit during the procedure of inserting it into the scanner. The carrier baseplate is preferably formed of a plastic material.

In a further embodiment, the at least one carrier unit has at least one spacer element and two or more receiving sections for respectively accommodating the shim elements. The at least one spacer element is arranged between two of the receiving sections. Preferably, the at least one spacer element is arranged between two directly adjacent receptacles of the at least one carrier unit. Preferably, one spacer element is arranged between each two adjacent receiving sections of the at least one carrier unit. The spacer elements produce an advantageous stability of the carrier unit when the carrier unit is inserted together with shim elements arranged in the scanner. In particular, an undesirable compressing of the carrier unit in the longitudinal direction during the insertion procedure is prevented.

In another embodiment of the invention, the two or more receptacles of the at least one carrier unit each have a cutout on the carrier baseplate. Flexibility of the carrier baseplate is increased by these cutouts. Furthermore, the cutout in each receptacle enables the individual shim element in that receptacle to be pushed out of the receptacle.

In another embodiment, the at least one carrier unit has a sidewall extending in the longitudinal direction, the sidewall having a number of sidewall elements and a number of cutouts, with the individual sidewall elements alternating with the individual cutouts. The alternating arrangement of the individual sidewall elements with the individual cutouts promotes the bendability and/or flexibility of the carrier unit, in particular of the carrier baseplate. Furthermore, a structurally simple lateral securing of the shim elements inside the receiving sections of the carrier unit is achieved by the individual sidewall elements.

In a further embodiment of the invention, the cutouts are designed as a segment of a circle in shape. Cutouts of this type permit an advantageous bending of a first subsection of the carrier unit through an angle of up to 90° with respect to a second subsection of the carrier unit, without risk of damage to the carrier unit, in particular to the sidewalls of the carrier unit, in the process.

Advantageously, the two subsections can be bent through 90° to one another at a radius of less than 250 mm. The two subsections can be bent through 90° to one another at a radius of less than 230 mm. The two subsections can be bent through 90° to one another at a radius of less than 210 mm. The two subsections can be bent through 90° to one another at a radius of less than 200 mm. The two subsections can be bent through 90° to one another at a radius of less than 190 mm. The two subsections can be bent through 90° to one another at a radius of less than 180 mm. The two subsections can be bent through 90° to one another at a radius of less than 170 mm. The two subsections can be bent through 90° to one another at a radius of less than 160 mm. The two subsections can be bent through 90° to one another at a radius of approx. 150 mm. The two subsections can be bent through 90° to one another at a radius of approx. 150 mm, without this leading to damage to the carrier unit.

Preferably, the distance between two adjacent sidewall elements substantially corresponds to the length of extent of the sidewall elements in the longitudinal direction. In particular, shearing forces occurring during a bending of the carrier unit can be reduced by this means. In particular, a distance between two directly adjacent sidewall elements substantially corresponds to an extension length of the sidewall elements in the longitudinal direction.

In a further embodiment of the invention, the at least one carrier unit has two sidewalls extending in the longitudinal direction, with the sidewall elements and the cutouts on the second sidewall being mirror-symmetrical to the arrangement of the sidewall elements and the cutouts on the first sidewall. Bendability and/or flexibility of the carrier unit, in particular of the carrier baseplate, is promoted by this means, and in addition a structurally simple lateral securing of the shim elements inside the receiving sections of the carrier unit is achieved by the individual sidewall elements.

Preferably, the shim unit is situated inside the gradient coil arrangement. In this configuration, the gradient coil arrangement has a shielding coil, the shim unit being arranged between the shielding coil and the gradient coil elements. As a result, the installation space that is available can be used for arranging and/or accommodating the shim unit. This furthermore enables a particularly compact arrangement of the shim unit inside the gradient coil arrangement. External shielding of the magnetic field can be provided by the shielding coil, thereby enabling the effects directed toward the exterior to be attenuated.

DESCRIPTION OF THE PREFERRED EMBODIMENTS

Figure 1:
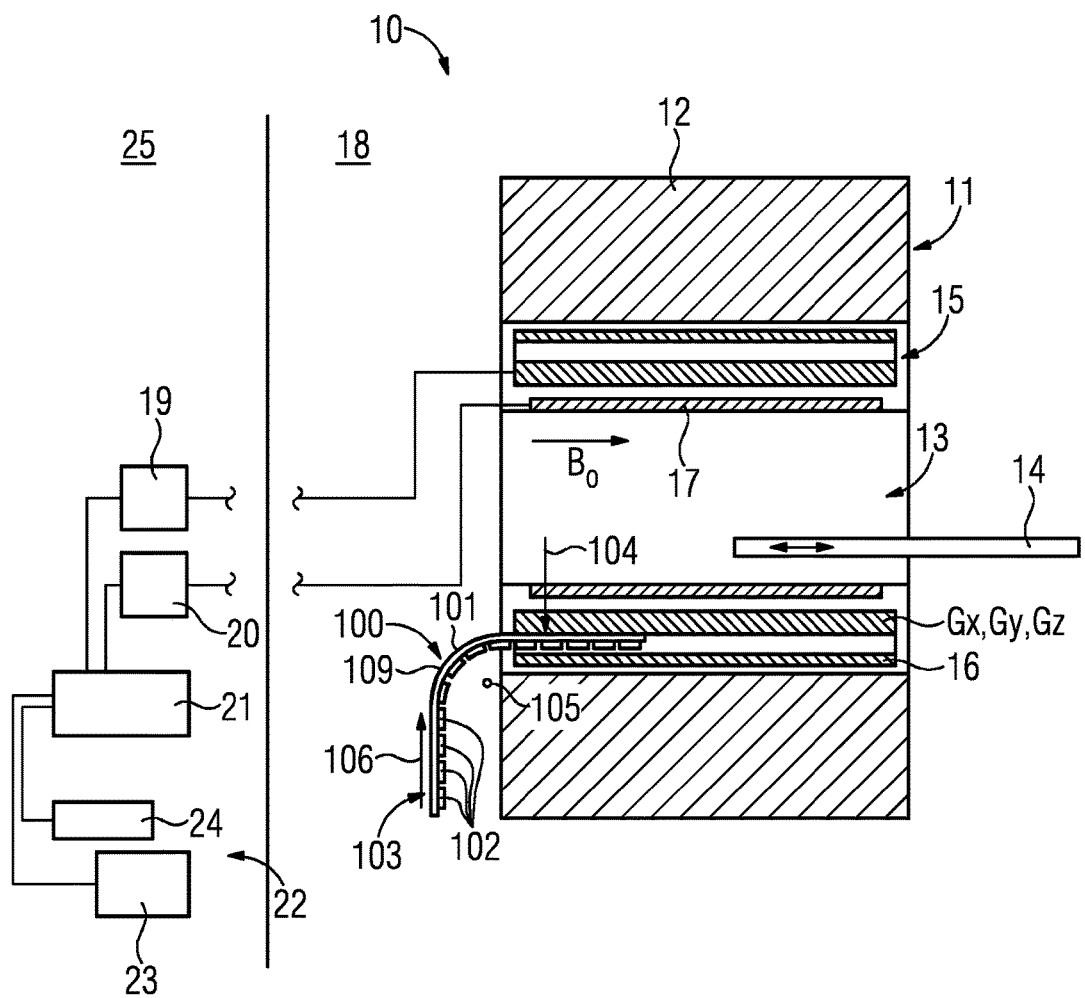
FIG. 1 shows a magnetic resonance apparatus according to the invention in a schematic representation.

A magnetic resonance apparatus 10 is shown schematically in FIG. 1. The magnetic resonance apparatus 10 has a scanner 11, which has a superconducting basic field magnet 12 that generates a strong and constant basic magnetic field $B_0$. The magnetic resonance scanner 11 has a patient receiving zone 13 for accommodating a patient. In the present exemplary embodiment, the patient receiving zone 13 is in the shape of a cylinder and is cylindrically circumferentially enclosed by the scanner 11. In principle, a different embodiment of the patient receiving zone 13 is possible. The patient can be introduced into the patient receiving zone 13 by a patient support and positioning device 14 of the scanner 11. For this purpose, the patient support and positioning device 14 is movable inside the patient receiving zone 13.

The scanner 11 additionally has a gradient coil arrangement 15 that generates magnetic field gradients for spatially encoding the MR signals during an imaging session. To that end, the gradient coil arrangement 15 has individual gradient coil elements $G_X$, $G_Y$, $G_Z$. The gradient coil elements $G_X$, $G_Y$, $G_Z$ furthermore have a shielding coil 16, which is arranged outside of the gradient coil elements $G_X$, $G_Y$, $G_Z$ in the radial direction. The shielding coil 16 is furthermore arranged at a distance from the gradient coil elements $G_X$, $G_Y$, $G_Z$ inside the gradient coil arrangement 15. External shielding of magnetic fields is provided by the shielding coil 16, thereby enabling effects directed toward the exterior to be attenuated.

The scanner 11 also has a radio-frequency antenna unit 17.

The scanner 11 is situated, together with the patient receiving zone 13 and the patient support and positioning device 14, in an examination room 18, which is shielded externally with respect to radio-frequency signals.

The gradient coil arrangement 15 is controlled by a gradient controller 19. The radio-frequency antenna unit 17 is controlled by a radio-frequency antenna controller 20, so as to radiate radio-frequency magnetic resonance sequences into the patient receiving zone 13 of the scanner 11. Nuclear spins in the patient are aligned in a steady state with the field lines of the basic magnetic field $B_0$. The radiated radio-frequency sequences cause certain nuclear spins in the patient to be given a magnetization that causes those nuclear spins to deviate from alignment with the basic magnetic field $B_0$ by an amount known as a flip angle. As these excited nuclear spins relax and return to the steady state, they emit magnetic resonance signals, which are also radio-frequency signals, that are detected by the same antenna from which the excitation sequence was radiated, or by a different antenna.

The magnetic resonance apparatus has a system controller (computer) 21 that controls the basic field magnet 12, the gradient controller 19 and the radio-frequency antenna controller 20. The system controller 21 is responsible for the centralized control of the magnetic resonance apparatus 10, such as for performing a predetermined imaging gradient echo sequence. In addition, the system controller 21 has an evaluation processor (not shown) that evaluates medical image data acquired during a magnetic resonance examination.

The magnetic resonance apparatus also has a user interface 22, which is connected to the system controller 21. Control information such as imaging parameters, for example, as well as reconstructed magnetic resonance images, can be displayed on a display unit 23, for example on at least one monitor, of the user interface 22 for a member of the medical operating staff. The user interface 22 additionally has an input unit 24 via which information and/or parameters can be entered by the member of the medical operating staff during a measurement procedure.

The gradient controller 19, the radio-frequency antenna controller 20, the system controller 21 and the user interface 22 are arranged inside a control room 25.

The magnetic resonance apparatus 10 has a shim unit 100 in order to reduce and/or suppress inhomogeneities in the basic magnetic field $B_0$. Magnetic field inhomogeneities in the basic magnetic field $B_0$ at an installation site of the magnetic resonance apparatus 10 are reduced and/or suppressed by the shim unit 100.

The shim unit 100 has a carrier unit 101 and a number of shim elements 102. The individual shim elements 102 are preferably formed of a ferromagnetic material. The shim elements 102 are inserted into the scanner 11 by the carrier unit 101. The shim elements 102 are inserted between the shielding coil 16 and the gradient coil elements $G_X$, $G_Y$, $G_Z$ inside the gradient coil arrangement 15 by the carrier unit 101.

Figure 2:
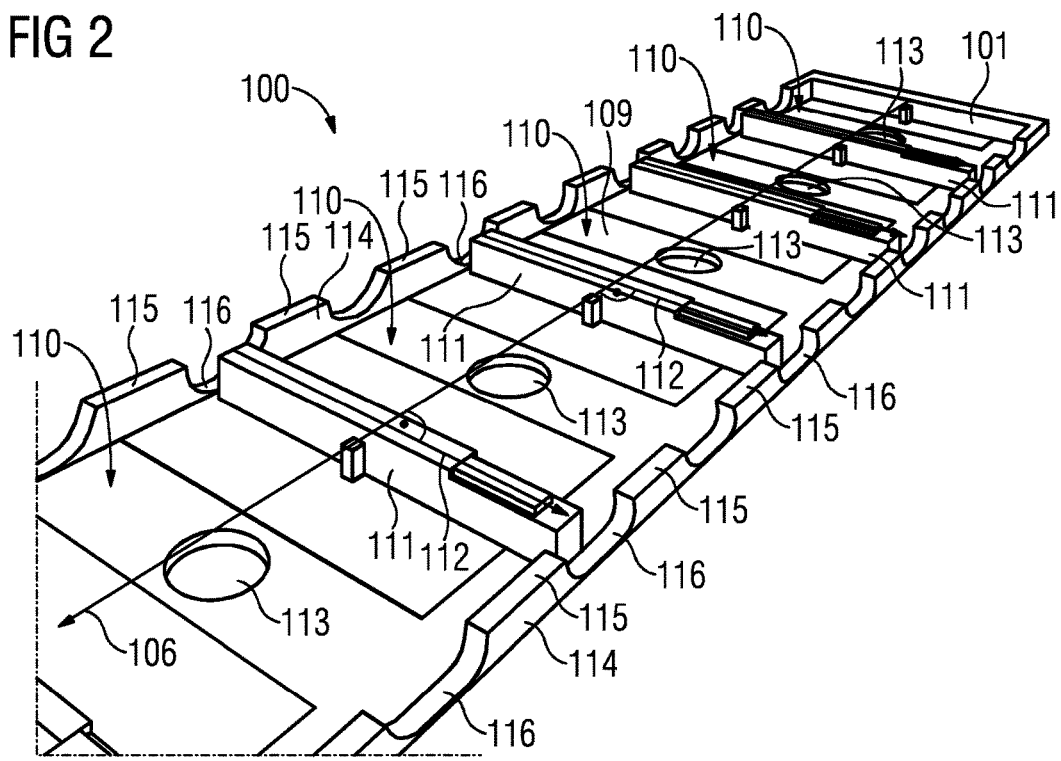
FIG. 2 shows a view of a carrier unit from above.
Figure 3:
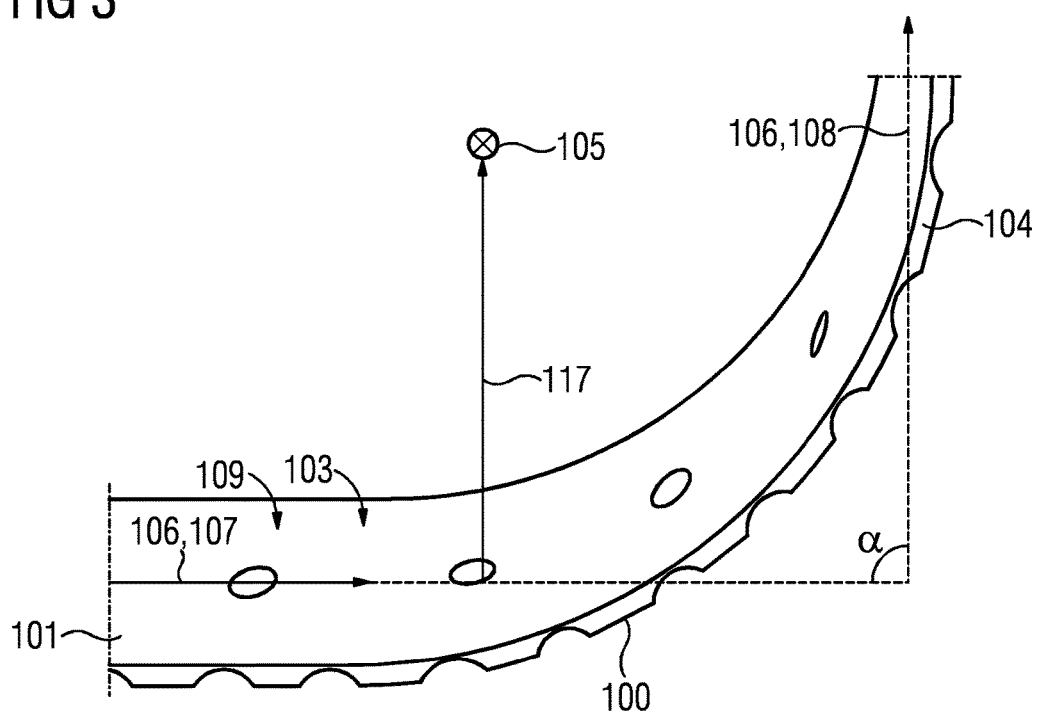
FIG. 3 shows a view of the carrier unit in a bent arrangement.

The carrier unit 101 of the shim unit 100 is fabricated from a plastic material and is illustrated in more detail in FIGS. 2 and 3. The carrier unit 101 is bendable in at least one direction. A first subsection 103 of the carrier unit 101 is bendable with respect to a second subsection 104 of the carrier unit 101 about a bending axis 105, the first subsection 103 being situated ahead of the second subsection 104 in the longitudinal direction 106. The first subsection 103 has a first direction of extent 107 and the second subsection 104 has a second direction of extent 108. The first direction of extent 107 is at a variable angle α with respect to the second direction of extent 108. Preferably, the variable angle α is in a range between 0° and a maximum of 90°. The bending axis 105 is arranged at the center of a circle whose radius corresponds to the radius of the bend.

The at least one direction in which the carrier unit 101 is bendable is preferably aligned at right angles to the longitudinal extent 106 of the carrier unit 101, in particular at right angles to the directions 107, 108 of the subsections 103, 104 of the carrier unit 101 that is to be bent. A bending force acts on the subsections 103, 104 that are bent and/or are to be bent, this bending force acting at least partially at right angles onto the subsections 103, 104 that are bent and/or are to be bent. The bending axis 105 of the carrier unit 101 is in this case aligned at right angles to the longitudinal direction 106 of the carrier unit 101, the longitudinal direction 106 also being the insertion direction, i.e. the direction in which the carrier unit 101 is introduced into the gradient coil arrangement 15 between the shielding coil 16 of the gradient coil arrangement 15 and the three gradient coil elements $G_X$, $G_Y$, $G_Z$ of the gradient coil arrangement 15.

The carrier unit 101 has a bendable carrier baseplate 109. The carrier unit 101 also has a number of receptacles 110 that are configured to accommodate the individual shim elements 102. In addition, the carrier unit 101 has a number of spacer elements 111, one spacer element 111 in each case being arranged between two adjacent receptacles 110, in particular between two directly adjacent receiving sections 110. In this configuration the spacer elements 111 are arranged directly on the carrier baseplate 109 on the side of the carrier baseplate 109 facing toward the receptacles 110. The individual spacer elements 111 of a carrier unit 101 are furthermore arranged parallel to one another on the carrier unit 101, on the carrier baseplate 109. The spacer elements 111 have a longitudinal extent 112 that proceeds transversely, at right angles, to the longitudinal direction 106 of the carrier unit 101, and thus of the carrier baseplate 109. Furthermore, the longitudinal extent 112 of each of the individual spacer elements 111 is parallel to an extension surface of the carrier baseplate 109.

The carrier baseplate 109 of the carrier unit 101 furthermore has a number of cutouts 113. In the exemplary embodiment, the cutouts 113 are circular. In principle, a design of the cutouts 113 that differs from a circular embodiment is also conceivable. One of the multiple cutouts 113 is inside a receptacle 110 in each case. In particular, one of the cutouts 113 is arranged centrally inside a receptacle 110 in each case. Accordingly, each of the receptacles 110 has a central cutout 113.

Furthermore, the carrier unit 101 has two sidewalls 114, each of which extends along the carrier unit 101 in the longitudinal direction 106. The longitudinal direction of the sidewalls 114 is therefore parallel to the longitudinal direction 106 of the carrier unit 101 and parallel to the longitudinal direction of the carrier baseplate 109. A first of the two sidewalls 114 is arranged on a first lateral longitudinal edge of the carrier baseplate 109. A second of the two sidewalls 114 is arranged on a second lateral longitudinal edge of the carrier baseplate 109. The two sidewalls 114 are therefore arranged on oppositely disposed lateral longitudinal edges on the carrier baseplate 109. The two sidewalls 114 therefore at least partially enclose the receptacles 110 of the carrier unit 101.

Each of the two sidewalls 114 has a number of sidewall elements 115 and a number of cutouts. The sidewall elements 115 alternate with the cutouts 116 within a sidewall 114. The arrangement of the sidewall elements 115 with the cutouts 116 on the two sidewalls 114 is mirror-symmetrical. The first sidewall 114 is in this case mirror-symmetrical to the second sidewall 114 with respect to a central axis, which is parallel to the longitudinal direction 106 of the carrier baseplate 109, of the carrier baseplate 109. Thus, the arrangement of the sidewall elements 115 and the cutouts 116 on the first sidewall 114 is mirror-symmetrical to the arrangement of the sidewall elements 115 and the cutouts 116 on the second sidewall 114.

In the exemplary embodiment, the cutouts 116 of the sidewalls 114 are a segment of a circle in shape. In principle, however, a different embodiment and/or fashioning of the cutouts 116 of the sidewalls 114 that is deemed appropriate by those skilled in the art is possible. The distance between each two adjacent sidewall elements 115 substantially corresponds to the length of extent of the sidewall elements 115 in the longitudinal direction 106.

This advantageously enables the first subsection 103 of the carrier unit 101 to be bent through up to 90° with respect to the second subsection 104 of the carrier unit 101. In particular, the two subsections 103, 104 can be bent through 90° to one another at a radius 117 of less than 250 mm. The two subsections 103, 104 can be bent through 90° to one another at a radius 117 of less than 230 mm. The two subsections 103, 104 can be bent through 90° to one another at a radius 117 of less than 210 mm. The two subsections 103, 104 can be bent through 90° to one another at a radius 117 of less than 200 mm. The two subsections 103, 104 can be bent through 90° to one another at a radius 117 of less than 190 mm. The two subsections 103, 104 can be bent through 90° to one another at a radius 117 of less than 180 mm. The two subsections 103, 104 can be bent through 90° to one another at a radius 117 of less than 170 mm. The two subsections 103, 104 can be bent through 90° to one another at a radius 117 of less than 160 mm. Preferably, the two subsections 103, 104 are bent through 90° to one another at a radius 117 of approx. 150 mm.

The shim unit 100 illustrated in FIG. 1 preferably has a number of carrier units 101, which can be arranged inside the gradient coil unit 15 between the shielding coil 16 and the gradient coil elements $G_X$, $G_Y$, $G_Z$. Preferably, a number of carrier units 101 having shim elements 102 arranged therein and distributed inside the gradient coil arrangement 15 are inserted in the radial direction between the shielding coil 16 and the gradient coil elements $G_X$, $G_Y$, $G_Z$ for the purpose of correcting magnetic field inhomogeneities.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. A magnetic resonance apparatus comprising:
   a magnetic resonance data acquisition scanner comprising a basic field magnet that generates a basic magnetic field in a patient-receiving zone of the scanner, and a gradient coil unit in the scanner, comprised of individual gradient coil elements, and a shim unit comprising at least one carrier unit that is movably introducible into the scanner, said carrier carrying at least two shim elements formed of a material for shimming said basic magnetic field; and
   said at least one carrier unit being bendable in at least one direction.

2. A magnetic resonance apparatus as claimed in claim 1 wherein said at least one carrier unit comprises at least one bending axis, said bending axis being aligned at right angles to a longitudinal direction of said at least one carrier unit.

3. A magnetic resonance apparatus as claimed in claim 1 wherein said at least one carrier unit comprises a bendable carrier baseplate that allows said at least one carrier unit to be bendable in said at least one direction.

4. A magnetic resonance apparatus as claimed in claim 1 wherein said at least one carrier unit comprises at least one spacer element and at least two receptacles that individually receive said at least two shim elements therein, said at least one spacer element being situated between two of said at least two receptacles.

5. A magnetic resonance apparatus as claimed in claim 4 wherein said at least one carrier unit comprises a bendable carrier baseplate that allows said at least one carrier unit to be bendable in said at least one direction, said receptacles being situated in said bendable carrier baseplate and said bendable carrier baseplate having a cutout in each of said receptacles.

6. A magnetic resonance apparatus as claimed in claim 5 wherein said at least one carrier unit comprises a sidewall longitudinally extending along said bendable carrier baseplate, said sidewall comprising a plurality of sidewall elements and a plurality of sidewall cutouts alternating with said sidewall elements.

7. A magnetic resonance apparatus as claimed in claim 6 wherein each sidewall cutout forms a segment of a circle.

8. A magnetic resonance apparatus as claimed in claim 6 wherein a distance between two adjacent sidewall elements corresponds to an extent of each sidewall element in the longitudinal direction.

9. A magnetic resonance apparatus as claimed in claim 6 wherein said at least one carrier unit comprises two sidewalls extending on opposite sides in the longitudinal direction of said bendable carrier baseplate, said sidewall elements and said sidewall cutouts of the respective two sidewalls being mirror-symmetrical.

10. A magnetic resonance apparatus as claimed in claim 1 wherein said shim unit is introducible into said scanner inside of said gradient coil unit.

11. A magnetic resonance apparatus as claimed in claim 1 wherein said gradient coil unit comprises a shielding coil, and wherein said shim unit is introducible between the shielding coil and the gradient coil elements of said gradient coil unit.

* * * * *